United States Patent
Hess et al.

(10) Patent No.: US 11,092,464 B2
(45) Date of Patent: Aug. 17, 2021

(54) HIGH SPEED AC INPUT SENSOR CONVERSION

(71) Applicant: Hamilton Sundstrand Corporation, Charlotte, NC (US)

(72) Inventors: Gary L. Hess, Somers, CT (US); Michael A. Wilson, Scottsdale, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 122 days.

(21) Appl. No.: 16/246,918

(22) Filed: Jan. 14, 2019

(65) Prior Publication Data

US 2020/0225062 A1   Jul. 16, 2020

(51) Int. Cl.
| G01D 5/22 | (2006.01) |
| H01F 21/06 | (2006.01) |
| H01F 27/28 | (2006.01) |
| H03M 1/48 | (2006.01) |

(52) U.S. Cl.
CPC ............ *G01D 5/2291* (2013.01); *H01F 21/06* (2013.01); *H01F 27/28* (2013.01); *H03M 1/485* (2013.01)

(58) Field of Classification Search
CPC ........ G01D 5/2291; H01F 21/06; H01F 27/28
See application file for complete search history.

(56) References Cited

U.S. PATENT DOCUMENTS

| 3,012,177 | A | * | 12/1961 | Mortimer | ............. | G01D 5/2033 |
| | | | | | | 318/647 |
| 4,943,766 | A | | 7/1990 | Suzuki | | |
| 6,005,398 | A | | 12/1999 | Landt | | |
| 7,006,935 | B2 | | 2/2006 | Seki | | |
| 7,248,994 | B1 | | 7/2007 | Stolan | | |
| 7,787,575 | B2 | | 8/2010 | Dawson et al. | | |
| 8,063,648 | B2 | | 11/2011 | Nilsson et al. | | |
| 8,587,351 | B1 | * | 11/2013 | Crandall | ............... | H03L 7/0812 |
| | | | | | | 327/155 |
| 2016/0320217 | A1 | * | 11/2016 | Ronning | ............ | G01R 33/0017 |
| 2017/0227567 | A1 | | 8/2017 | Son et al. | | |
| 2017/0299409 | A1 | * | 10/2017 | Hess | .................... | G01D 5/2073 |
| 2020/0225063 | A1 | * | 7/2020 | Hess | .................... | G01D 5/2291 |

FOREIGN PATENT DOCUMENTS

| EP | 1091493 A2 | 4/2001 |
| EP | 3239662 A1 | 11/2017 |

OTHER PUBLICATIONS

Extended European Search Report dated May 15, 2020, received for corresponding European Application No. 19209396.1, 10 pages.

* cited by examiner

*Primary Examiner* — Paresh Patel
(74) *Attorney, Agent, or Firm* — Kinney & Lange, P.A.

(57) ABSTRACT

A system for determining an amplitude of a sinusoidal output waveform from a sensor includes a controller configured to provide a sample signal having a sample frequency that is four times a frequency of a sinusoidal excitation waveform provided to the sensor. The sensor has inductively-coupled primary and secondary windings that produce the sinusoidal output waveform from the secondary winding when the excitation waveform is provided to the primary winding. An analog-to-digital converter measures a first and second voltage of the sensor waveform separated in time by the period of the sample frequency, and the system calculates the amplitude based on the measurements of the first and second voltages.

20 Claims, 3 Drawing Sheets

HIGH SPEED AC INPUT SENSOR CONVERSION

CROSS-REFERENCE TO RELATED APPLICATION(S)

Reference is hereby made to U.S. patent application Ser. No. 16/246,956, entitled "HIGH SPEED AC SENSOR PHASE MEASUREMENT", which is filed on the same date as this application.

BACKGROUND

The present disclosure relates to electronic measurement circuits, and more particularly, to high-speed electronic measurement circuits for determining the voltage and the phase shift of an AC signal.

Resolvers, linear variable differential transformers (LVDTs), and proximity sensors are commonly used to determine the position of movable components in machinery, control systems, and the like. For example, resolvers are oftentimes associated with starter motor generators and actuators in aircraft to provide feedback regarding the state of the actuator, e.g., whether the actuator is open, partially open, or closed. A typical resolver includes a primary winding and at least one secondary winding, rotatable with respect to the primary winding. In other applications, such as mechanical control systems, LVDTs are used to determine the linear position of linearly moving components. For example, LVDTs are oftentimes associated with fuel racks on gas turbine engines to provide feedback regarding the state of the fuel control valves, e.g., whether the valve is open, partially open, or closed. A typical LVDT includes a primary winding, at least one secondary winding, and a linearly movable ferromagnetic core that alters the mutual inductive coupling between the primary the secondary winding(s). In yet other applications, proximity sensors can be used to determine the proximity of a target to a source component, with a primary winding on either the target or the source, and the secondary winding on the other.

Resolvers, LVDTs, and proximity sensors are related in that a sinusoidal waveform is typically applied to a primary coil, thereby inducing a secondary voltage in the one or more secondary coils through mutual inductive coupling between the primary and the secondary windings. The amplitude and/or phase of the induced secondary voltage can be indicative of a relative position between the primary and secondary windings, and/or of a position of a moveable magnetic core that affects the mutual inductive coupling. Many resolver, LVDT, and proximity sensor algorithms require a full cycle of the sinusoidal waveform to determine the amplitude of the induced secondary voltage. Moreover, many resolver, LVDT, and proximity sensor algorithms require more than a full cycle of the induced secondary voltage to calculate the phase shift, because the algorithm requires the detection of zero crossings.

Advanced systems are dependent on highly-responsive sensor systems for optimum functioning. Accordingly, it would be beneficial to provide improved interfaces for resolvers, LVDTs, and proximity sensors that can provide a high-speed measurement of the voltage and/or phase of the induced secondary voltage in less than half of a waveform cycle.

SUMMARY

A system for determining an amplitude of a sinusoidal output waveform from a sensor includes a controller configured to provide a sample signal having a sample frequency that is four times a frequency of a sinusoidal excitation waveform provided to the sensor, measure a first voltage of the sinusoidal output waveform and a second voltage of the sinusoidal output waveform via an analog-to-digital converter (ADC), the second voltage measurement occurring at a time corresponding to a period of the sample frequency following the first voltage measurement, and calculate the amplitude of the sinusoidal output waveform based on the measurements of the first and second voltages. The sensor includes a primary winding configured to receive the sinusoidal excitation waveform and a secondary winding that is inductively coupled to the primary winding and is configured to produce the sinusoidal output waveform when the sinusoidal excitation waveform is provided to the primary winding.

A method of using an electronic circuit to determine an amplitude of a sinusoidal waveform includes providing by a controller an excitation signal having an excitation frequency to an exciter, providing by the controller a sample signal having a sample frequency that is four times the excitation frequency to an analog-to-digital converter (ADC), supplying by the exciter a sinusoidal excitation waveform having the excitation frequency to a primary winding, measuring by the ADC a first voltage of the sensor waveform and a second voltage of the sensor waveform, the second voltage measurement occurring at a time corresponding to the period of the sample frequency following the first voltage measurement, and calculating by the controller the amplitude based on the measurements of the first and second voltage. The primary winding is inductively coupled to a secondary winding, the secondary winding is configured to produce a sensor waveform when the sinusoidal excitation waveform is supplied to the primary winding, and the secondary winding is configured to input the sensor waveform to an ADC.

DETAILED DESCRIPTION

The present disclosure provides high-speed electronic measurement circuitry that can determine the voltage and phase shift of an AC signal using two samples of a sinusoidal waveform spaced $\pi/2$ radians (i.e., 90 deg.) apart. The circuitry can apply trigonometric substitutions to the samples, and determine the amplitude of the measured waveform. The circuitry can calculate the root-mean-square (RMS) value of the waveform from the determined amplitude. This can provide a rapid determination of the RMS value of an AC signal in less than a half-cycle. Related circuitry can provide a rapid determination of a phase shift in less than a half-cycle. An appreciation of the present disclosure is best obtained by having an understanding of the prior art.

Figure 1:
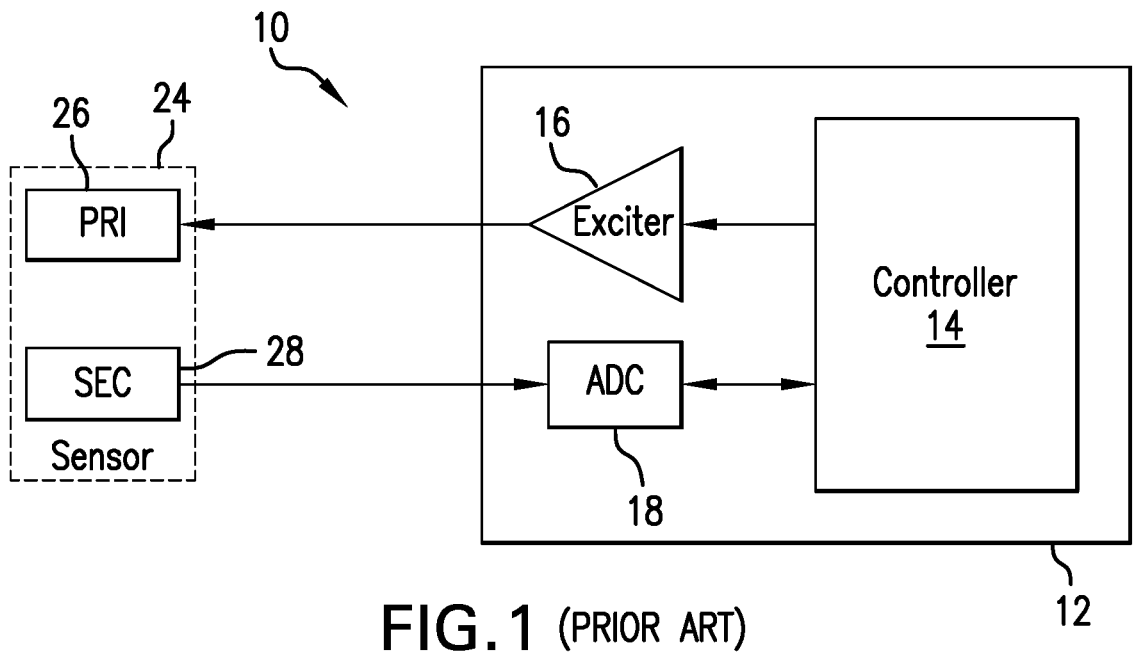
FIG. 1 is a schematic block diagram of a voltage measurement system of the prior art.

FIG. 1 is a schematic block diagram of a voltage measurement system of the prior art. Shown in FIG. 1 are voltage measurement system 10, electronic control 12, controller 14, exciter 16, analog-to-digital converter (ADC) 18, sensor 24, primary winding 26, and secondary winding 28. Electronic control 12 includes controller 14, exciter 16, and ADC 18. Controller 14 provides a signal to exciter 16, in turn producing a sinusoidal waveform that is applied to sensor 24. Sensor 24 can be a resolver, linear variable differential transformer (LVDT), proximity sensor, or other sensor type having primary winding 26 and secondary winding 28. Mutual inductive coupling between primary winding 26 and secondary winding 28 cause a voltage to be induced in secondary winding 28, which is input to ADC 18. The digital output of ADC 18 is input to and processed by controller 14. Typical methods of determining the amplitude of the secondary voltage from secondary winding 28 include oversampling the secondary voltage and determining the location of the signal peak by using a zero-crossing detector. A fast Fourier transform (FFT) can also be utilized as a digital signal processing technique. The aforementioned methods typically require at least a full cycle of a sinusoidal waveform to accomplish, and some systems can require two or more waveform cycles. While voltage measurement system 10 can provide an adequate level of performance in systems where the parameter being measured changes slowly relative to the period of the sinusoidal waveform, system response can be too slow for rapidly-changing parameters.

Figure 2:
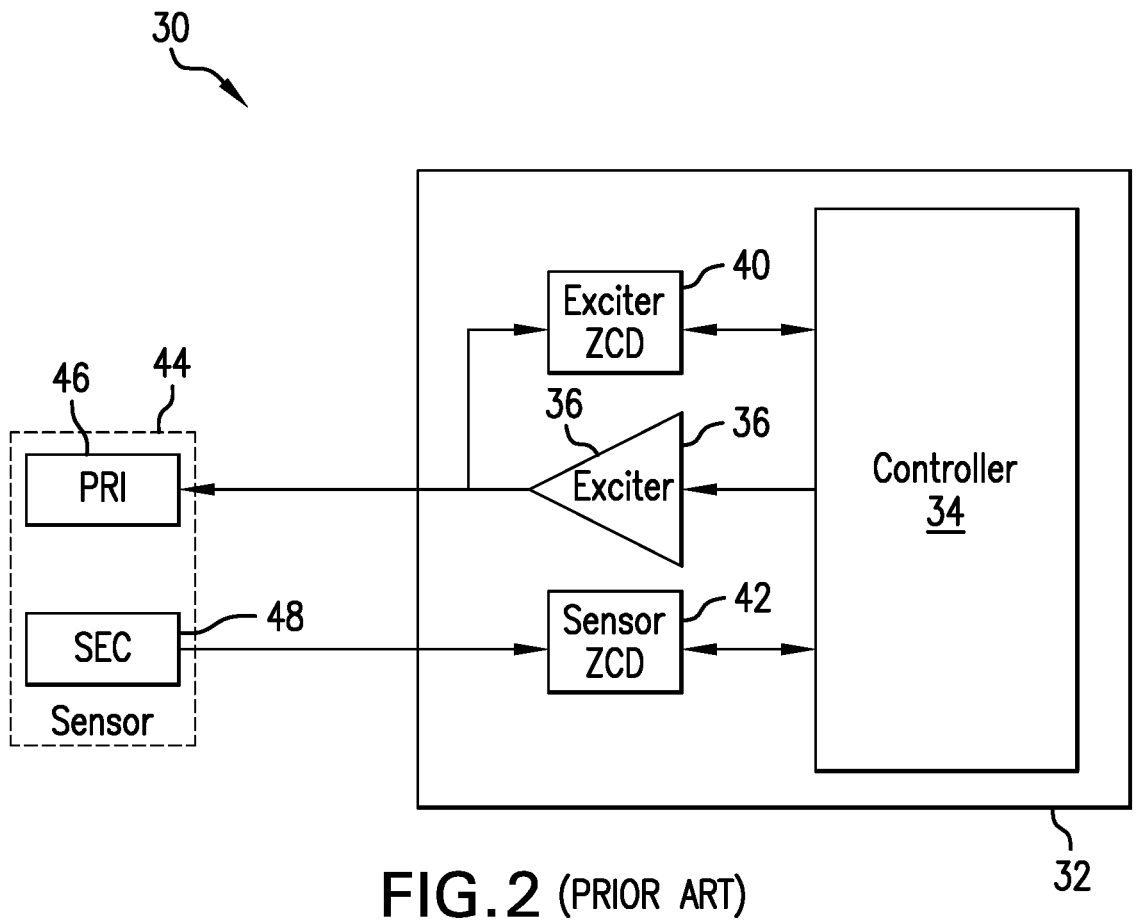
FIG. 2 is a schematic block diagram of a phase measurement system of the prior art.

FIG. 2 is a schematic block diagram of a phase measurement system of the prior art. Shown in FIG. 2 are phase measurement system 30, electronic control 32, controller 34, exciter 36, exciter zero-crossing detector (ZCD) 40, sensor ZCD 42, sensor 44, primary winding 46, and secondary winding 48. Phase measurement system 30 can be used to measure the phase shift between a primary signal and a secondary signal, for example, in systems described above in regard to FIG. 1. Electronic control 32 includes controller 34, exciter 36, exciter ZCD 40, and sensor ZCD 42. Controller 34 provides a signal to exciter 36, in turn producing a sinusoidal waveform that is applied to sensor 44. Sensor 44 can be a resolver, LVDT, or proximity sensor, having primary winding 46 and secondary winding 48. Mutual inductive coupling between primary winding 46 and secondary winding 48 cause a voltage to be induced in secondary winding 48, which is input to sensor ZCD 42. Controller 34 receives and compares the outputs of exciter ZCD 40 and sensor ZCD 42, thereby calculating the phase shift between exciter 36 output (i.e., the waveform applied to primary winding 46) and the waveform that is induced in secondary winding 48. A measurement of the phase shift can be used to determine a rotary position of a resolver, for example. The aforementioned method typically requires at least a full cycle of a sinusoidal waveform to accomplish, and some systems can require two or more waveform cycles. While phase measurement system 30 can provide an adequate level of performance in systems where the parameter being measured changes slowly relative to the period of the sinusoidal waveform, system response can be too slow for rapidly-changing parameters. A rapid phase shift can also provide an indication of a failure of sensor 44. Determination of a failure of sensor 44 within one-to-two waveform cycles can be acceptable in some situations, although a faster response can be beneficial in other situations.

Figure 3:
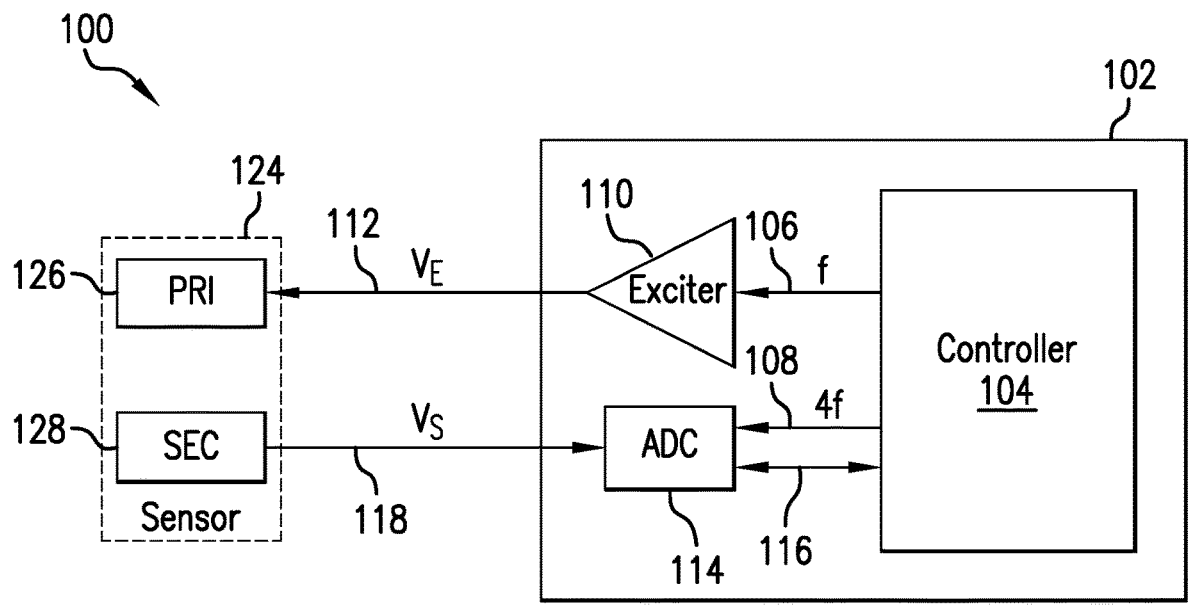
FIG. 3 is a schematic block diagram of a high-speed AC voltage sensor.

FIG. 3 is a schematic block diagram of a high-speed AC voltage sensor. Shown in FIG. 3 are high-speed voltage sensor 100, electronic control 102, controller 104, fundamental frequency signal 106 having fundamental frequency (f), 4× fundamental frequency signal 108 having frequency 4f, exciter 110, exciter output 112, ADC 114, ADC output 116, secondary winding output 118, sensor 124, primary winding 126, and secondary winding 128. Electronic control 102 includes controller 104, exciter 110, ADC 114, and ADC output 116. Electronic control 102 can be referred to as an electronic circuit. Sensor 124 can be a resolver, LVDT, proximity sensor, or other sensor type having primary winding 126 and secondary winding 128. Primary winding 126 can include one or more coils, and/or secondary winding 128 can include one or more coils. Mutual inductive coupling between primary winding 126 and secondary winding 128 cause a voltage to be induced in secondary winding 128, with the mutual inductive coupling being influenced by one or more measurable parameters. In one embodiment, for example, the position of one or more secondary windings 128 relative to primary winding 126 can induce a varying voltage and/or phase shift in secondary winding 128. In another embodiment, the position of a moveable ferromagnetic core (not shown) near sensor 124 can induce a varying voltage and/or phase shift in secondary winding 128. In yet another embodiment, the physical separation between primary winding 126 and secondary winding 128 can induce a varying voltage and/or phase shift in secondary winding 128.

Referring again to FIG. 3, controller 104 produces two frequencies: fundamental frequency (f) and 4× fundamental frequency (4f). Fundamental frequency (f) can also be referred to as the excitation frequency (f), and 4× fundamental frequency (4f) can be referred to as the sample frequency. In the illustrated embodiment, the excitation frequency can be between 2,000-3,500 Hz. The relationship between excitation frequency (f) and the period (T) of the excitation waveform is given by:

$$T = \frac{1}{f} \qquad \text{Equation 1}$$

For example, if excitation frequency (f) is 2,500 Hz (i.e., 2.5 KHz), then period (T) is 0.0004 sec (i.e., 0.4 msec).

Referring again to FIG. 3, controller 104 drives exciter 110 at fundamental frequency (f), and exciter 110 in turn applies excitation voltage ($V_E$) 112 to primary winding 126, thereby inducing secondary voltage ($V_S$) in secondary winding 128 and provided as secondary winding output 118. Secondary winding output 118 provides secondary voltage ($V_S$) as an input to ADC 114. Secondary winding output 118 can also be referred to as input voltage, because it is an input to electronic control 102. It is to be appreciated that excitation voltage ($V_E$) and/or secondary voltage ($V_S$) can be written with or without the use of a subscript (i.e., $V_E$ or VE, and $V_S$ or VS, respectively), while having the same meaning within the scope of the present disclosure. ADC 114 also receives an input of 4× fundamental frequency signal 108 from controller 104. The time period between two consecutive cycles of 4× fundamental frequency signal 108 is T/4, where T is the period of the excitation waveform. ADC 114 takes two consecutive samples of secondary voltage ($V_S$) spaced T/4 apart, providing ADC output 116 to controller 104. Referring again to the previous example, if excitation frequency (f) is 2,500 Hz, then period (T) is 0.4 msec, and T/4 is 0.1 msec. Because secondary voltage ($V_S$) is a sinusoidal waveform, the period between two consecutive samples of secondary voltage ($V_S$) can be expressed as $\pi/2$ rad., or 90 deg.

From taking two samples $\pi/2$ rad. apart, the root-mean-square (RMS) voltage of a sinusoidal waveform can be expressed as:

$$V_{RMS} = \sqrt{\frac{\left(V_{PK}(\sin(x))^2 + V_{PK}(\sin(x+\frac{\pi}{2}))^2\right)}{2}} \quad \text{Equation 2}$$

By applying the trigonometric identity of:

$$\cos(x) = \sin\left(x + \frac{\pi}{2}\right) \quad \text{Equation 3}$$

Yields the following:

$$V_{RMS} = V_{PK}\sqrt{\frac{[(\sin(x))^2 + (\cos(x))^2]}{2}} \quad \text{Equation 4}$$

By applying the trigonometric identity of:

$$\sin(x)^2 + \cos(x)^2 = 1 \quad \text{Equation 5}$$

Yields the following:

$$V_{RMS} = V_{PK}\sqrt{\frac{1}{2}} \quad \text{Equation 6}$$

As shown with equations 2-5, two samples of secondary voltage ($V_S$) taken exactly $\pi/2$ rad. apart (i.e., separation in time of T/4) yields the exact measurement of the RMS value of secondary voltage ($V_S$). It is to be appreciated that equation 6 is also the definition of the RMS value of a sinusoidal voltage. Accordingly, high-speed voltage sensor 100 can measure secondary voltage ($V_S$) in a time span of T/4 (i.e., the period corresponding to the sample frequency). Therefore, high-speed voltage sensor 100 can be used in an embodiment where it can be beneficial to quickly measure an AC voltage signal and/or quickly detect a change in an AC voltage signal, which can be indicative of a change in a sensor position.

Figure 4:
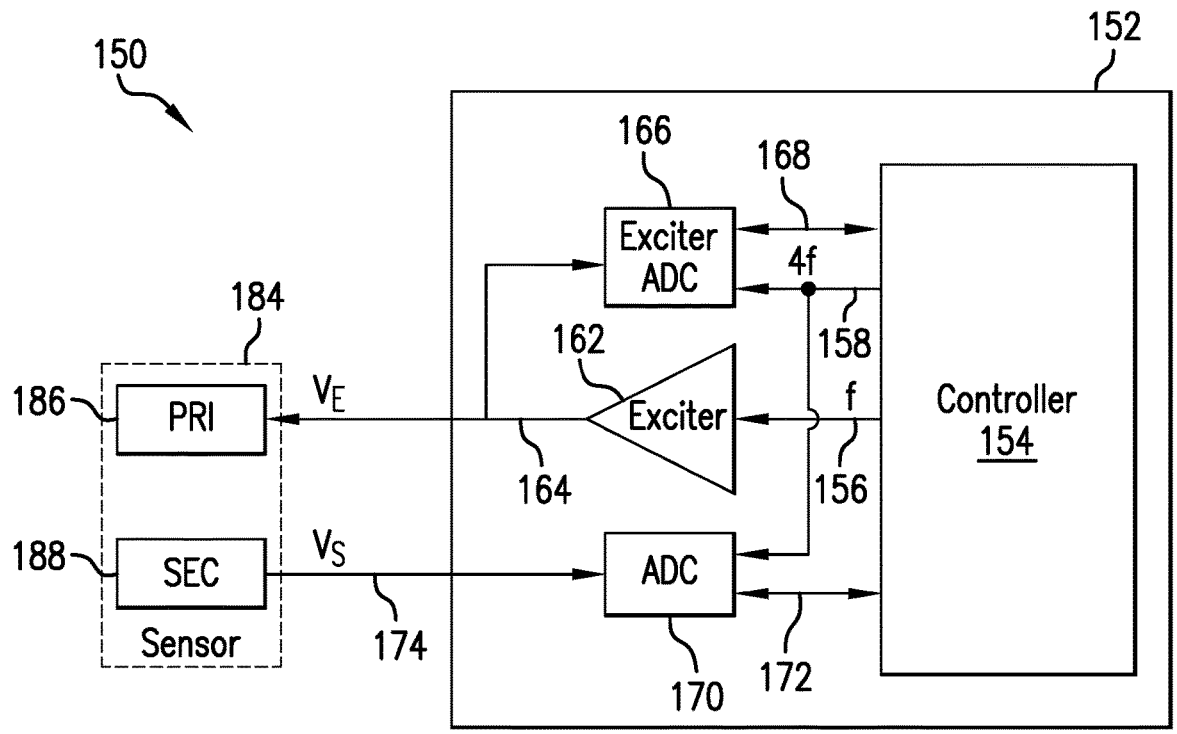
FIG. 4 is a schematic block diagram of a high-speed AC phase sensor.

FIG. 4 is a schematic block diagram of the high-speed AC phase sensor. Shown in FIG. 4 are high-speed phase sensor 150, electronic control 152, controller 154, fundamental frequency signal 156 having fundamental frequency (f), 4× fundamental frequency signal 158 having 4× fundamental frequency (4f), exciter 162, exciter output 164, excitation voltage ($V_E$), exciter ADC 166, exciter ADC output 168, ADC 170, ADC output 172, secondary winding output 174, secondary voltage 174, sensor 184, primary winding 186, and secondary winding 188. Electronic control 152 includes controller 154, exciter 162, exciter ADC 166, and ADC 170. Electronic control 152 can be referred to as an electronic circuit. Sensor 184 includes primary winding 186 and secondary winding 188, and is substantially as described above with regard to FIG. 3. Controller 154 produces two frequencies: fundamental frequency (f), and 4× fundamental frequency (4f). Fundamental frequency (f) can also be referred to as the excitation frequency. The description of fundamental frequency (f), 4× fundamental frequency (4f) (i.e., sample frequency), and the determination of the period (T) of the excitation waveform are substantially as described above with regard to FIG. 3.

Controller 154 drives exciter 162 at fundamental frequency (f), and exciter 162 in turn provides exciter output 164 having excitation voltage ($V_E$) to primary winding 186, thereby inducing secondary voltage ($V_S$) in secondary winding 188. Secondary winding output 174 provides secondary voltage ($V_S$) as an input to ADC 170. Secondary voltage ($V_S$) can also be referred to as input voltage ($V_{input}$) because it is an input to electronic control 152. Exciter 162 also applies excitation voltage ($V_E$) to exciter ADC 166. In the illustrated embodiment, exciter ADC 166 is a four-quadrant (i.e., wrap-around) ADC-converter, meaning that quadrature values having proper sign values are calculated. Exciter ADC 166 can also be referred to as a high-speed wrap-around ADC-converter. Exciter ADC 166 and ADC 170 each receive 4× fundamental frequency signal 158 having 4× fundamental frequency (4f) from controller 154, thereby commanding exciter ADC 166 and ADC 170 to each take two consecutive samples at their respective inputs separated by timespan T/4, with the first of each sample being taken at the same point in time and the second of each sample being taken at the same point in time. In particular, exciter ADC 166 takes two consecutive samples of excitation voltage ($V_E$), and ADC 170 takes two consecutive samples of secondary voltage ($V_S$). It is to be noted that excitation voltage ($V_E$) and secondary voltage ($V_S$) have the same frequency (i.e., fundamental frequency (f) having period T). Moreover, because excitation voltage ($V_E$) and secondary voltage ($V_S$) are both sinusoidal waveforms, the angular separation between two consecutive samples taken T/4 apart can be expressed as $\pi/2$ rad. (i.e., 90 deg.)

The phase difference ($\theta_D$) (i.e., phase shift) between excitation voltage ($V_E$) and secondary voltage ($V_S$) can be shown through the following series of equations, beginning with the trigonometric identity of equation 3, where x is a voltage measurement at a point:

$$\cos(x) = \sin\left(x + \frac{\pi}{2}\right) \quad \text{Equation 3}$$

Applying the arctangent (atan) identity:

$$\theta = \operatorname{atan}\left(\frac{\sin(x)}{\cos(x)}\right) \quad \text{Equation 7}$$

Yields the following identity:

$$\theta = \operatorname{atan}\left(\frac{\sin(x)}{\sin(x + \frac{\pi}{2})}\right) \quad \text{Equation 8}$$

The two consecutive samples of excitation voltage ($V_E$) spaced $\pi/2$ rad. apart are represented as $V_{E1}$ and $V_{E2}$, respectively. Similarly, the two consecutive samples of secondary voltage ($V_S$) (i.e., input voltage ($V_{input}$)) spaced $\pi/2$ rad. apart are represented as $V_{S1}$ and $V_{S2}$, respectively. In the illustrated embodiment, electronic control 152 applies a four-quadrant arctangent function. The four-quadrant arctangent function can also be denoted as "atan2". As used in the present disclosure, "atan" means a four-quadrant (i.e., atan2 or wrap-around) arctangent value is used. In one particular embodiment, exciter ADC 166 can be a bipolar ADC, thereby being able to convert positive and negative voltages for proper quadrature operation. In another particular embodiment, exciter ADC 166 can be a unipolar ADC while having a bias offset or other appropriate scaling function applied to its input, thereby being able to provide proper quadrature operation.

Accordingly, by applying the identities of equations 7 and 8, the phase difference ($\theta_D$) between excitation voltage ($V_E$) and secondary voltage ($V_S$) can be represented as:

$$\theta_D = \left(\operatorname{atan}\left(\frac{V_{E1}}{V_{E2}}\right)\right) - \left(\operatorname{atan}\left(\frac{V_{S1}}{V_{S2}}\right)\right) \qquad \text{Equation 9}$$

Therefore, high-speed phase sensor 150 can be used in an embodiment where it can be beneficial to quickly measure an AC phase difference and/or quickly detect a change in an AC phase difference, which can be indicative of a change in a sensor position. In some embodiments, a sudden change in an AC phase difference can be indicative of a failed sensor. Therefore, in these embodiments, high-speed phase sensor 150 can rapidly detect the failure of sensor 184, and this rapid detection can occur more quickly than other detection means. Moreover, because high-speed phase sensor 150 can measure an AC phase difference in a time span representing ¼ of the AC waveform period, it can be seen that a higher excitation frequency can result in a shorter measurement time span.

Figure 5:
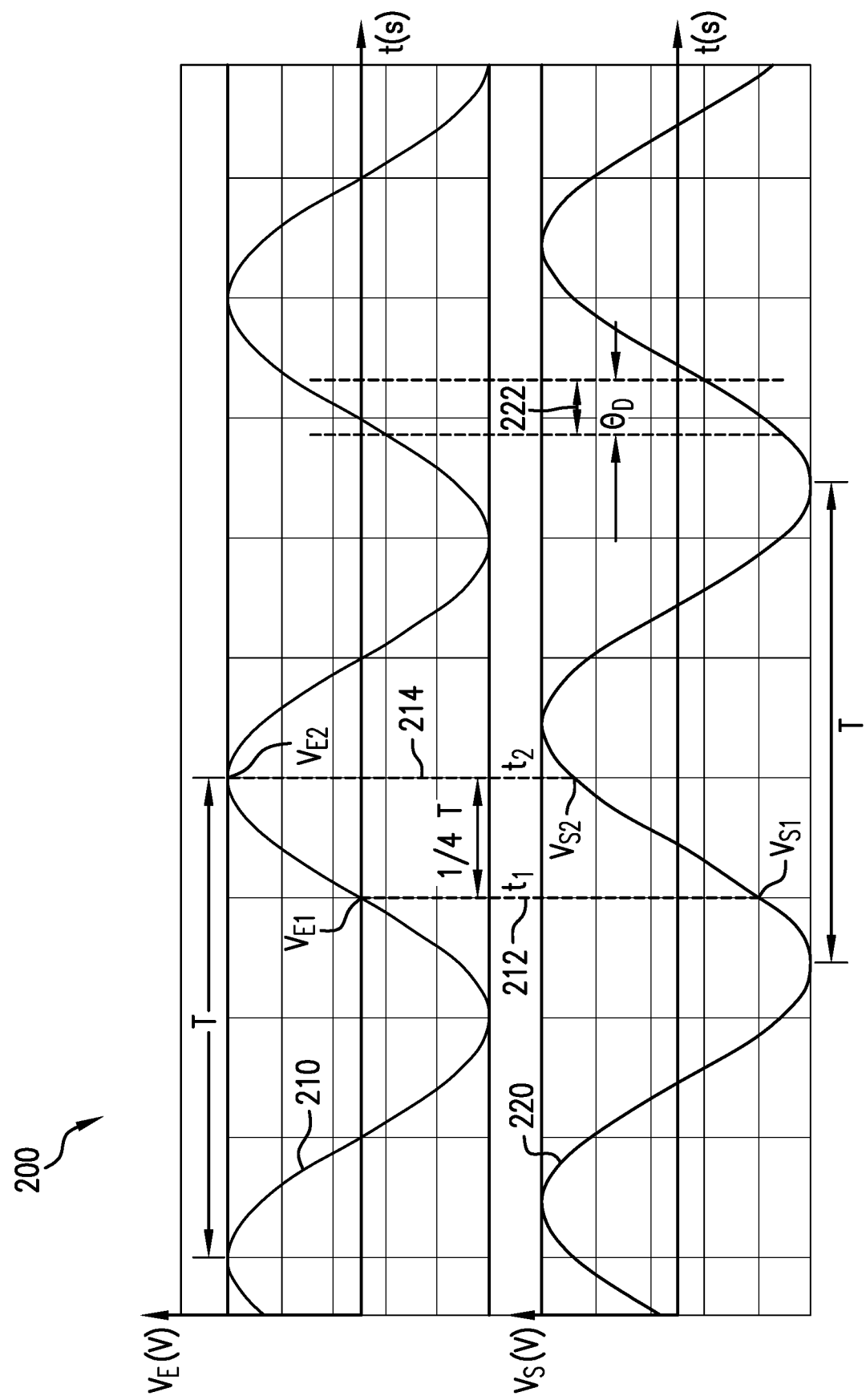
FIG. 5 is a pair of waveforms depicting the voltage and phase measurements in the high-speed AC voltage sensor and high-speed AC phase sensor.

FIG. 5 is a pair of waveforms depicting the voltage and phase measurements in high-speed AC voltage sensor 100 and high-speed AC phase sensor 150 on axes of voltage ($V_E$, $V_S$) in volts vs. time in seconds. Shown in FIG. 5 are waveforms 200, excitation voltage ($V_E$) waveform 210, secondary voltage ($V_S$) waveform 220, first measurement ($t_1$) 212, second measurement ($t_2$) 214, and phase difference ($\theta_D$) 222. Period (T) of excitation waveform, and T/4, are both depicted, with T equating to $2\pi$ rad., and T/4 equating to $\pi/2$ rad. In the exemplary embodiment shown in FIG. 5, the peak amplitudes of excitation voltage ($V_E$) and secondary voltage ($V_S$) are normalized for illustration purposes. It is to be noted that units of time and voltage are not provided with waveforms 200.

In the embodiments illustrated above in FIGS. 3-5, the excitation frequency (f) can be between 2,000-3,500 Hz. For example, in a particular embodiment, excitation frequency (f) can be 2,500 Hz (i.e., 2.5 KHz). Accordingly, period (T) is 0.4 msec, the measurement frequency 10 KHz, and the time span between two voltage measurements is 0.1 msec (i.e., 100 μsec). In some embodiments, excitation frequency (f) can range between 400-5,000 Hz. In other embodiments, excitation frequency (f) can be less than 400 Hz or greater than 5,000 Hz. It can be appreciated that a higher value of excitation frequency (f) can result in a shorter time span between two voltage measurements.

In the embodiments illustrated in FIGS. 3-5, the amplitude of excitation voltage ($V_E$) can be between 5-12 volts peak. In other embodiments, the amplitude of excitation voltage ($V_E$) can be less than 5 volts peak or greater than 12 volts peak. In the embodiments illustrated in FIGS. 3-5, the amplitude of the secondary voltage ($V_S$) can be between 1-5 volts peak. In other embodiments, the amplitude of the secondary voltage ($V_S$) can be less than 1 volt peak or greater than 5 volts peak.

In some of the embodiments illustrated above in FIGS. 3-4, sensor 124, 184 can be a resolver that includes a rotatable primary winding, a fixed secondary winding fixed relative to the rotatable primary winding, and a fixed tertiary winding fixed relative to the rotatable primary winding and positioned $\pi/2$ radians out of phase with respect to the fixed secondary winding. The rotatable primary winding can be mechanically connected to a rotating component (not shown). The rotating component can rotate completely, either continuously or intermittently. In some of these embodiments, the rotating component can rotate in either a forward (clockwise) or a reverse (counter-clockwise) direction. In other of these embodiments, the rotating component can rotate in an arc that is less than $2\pi$ radians (360 deg.) Non-limiting examples of the rotating component include a shaft in a gas turbine engine, crankshafts on internal and external combustion engines, shafts on electromechanical machines, synchros, gyrocompasses, dial indicators, and other shafts, dials, rotors, and the like.

In some of the embodiments illustrated above in FIGS. 3-4, sensor 124, 184 can be a LVDT that includes a movable ferromagnetic core that is mechanically connected to linearly movable component (not shown) having a range of motion between about 2.5-5 cm (0.98-1.97 inches). In some of these embodiments, the linearly movable component can have a range of motion that is less than 2.5 cm (0.98 inches). In other of these embodiments, the linearly movable component can have a range of motion that is greater than 5 cm (1.97 inches). In yet other of these embodiments, the linearly movable component can have a range of motion that is greater than 25 cm (9.84 inches). Non-limiting examples of a linearly movable component include a linear component in a gas turbine engine and any linearly movable mechanism on any mechanical or electromechanical component or system.

In some of the embodiments illustrated above in FIGS. 3-4, sensor 124, 184 can be a proximity sensor that is configured to determine the proximity of a source (not shown) to a target (not shown). In some of these embodiments, the proximity detection range can be between 2.5-10 cm (0.98-3.94 inches). In other of these embodiments, the proximity detection range can be between 1-25 cm (0.39-9.84 inches). In yet other of these embodiments, the proximity detection range can be less than 1 cm (0.39 inch) or more than 25 cm (9.84 inches). Non-limiting examples of applications of a proximity sensor include gas turbine engines, fixed- and rotary-wing aircraft, aircraft handling and maintenance equipment, process control systems, and factories.

In the embodiments illustrated above in FIGS. 3-5, it should be understood that the computing algorithms that are performed by controllers 104, 154 can be implemented in digital logic or by a processor, and can involve computing in-phase and quadrature-phase resultants of the sampled excitation and secondary voltages. Further, it should also be noted that a computing device can be used to implement various functionality, such as that attributable to the method of digital demodulation and other functions performed by a field-programmable gate array (FPGA). In terms of hardware architecture, such a computing device can include a processor, a memory, and one or more input and/or output (I/O) device interface(s) that are communicatively coupled via a local interface. The local interface can include, for example but not limited to, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The aforementioned processor can be a hardware device for executing software, particularly software stored in memory. The processor can be a custom made or commercially available processor, a central processing unit (CPU), an auxiliary processor among several processors associated with the computing device, a semiconductor based microprocessor (in the form of a microchip or chip set), or generally any device for executing software instructions. The memory can include any one or combination of volatile memory elements, e.g., random access memory (RAM, such as DRAM, SRAM, SDRAM, VRAM, etc.) and/or nonvolatile memory elements, e.g., ROM, hard drive, tape, CD-ROM, etc. Moreover, the memory may incorporate electronic, magnetic, optical, and/or other types of storage media. Note that the memory can also have a distributed architecture, where various components are situated remotely from one another, but can be accessed by the processor. The software in the memory may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory.

The aforementioned I/O devices that may be coupled to system I/O interface(s) may include input devices, for example but not limited to, a keyboard, mouse, scanner, microphone, camera, proximity device, etc. Further, the I/O devices may also include output devices, for example but not limited to, a printer, display, etc. Finally, the I/O devices may further include devices that communicate both as inputs and outputs, for instance but not limited to, a modulator/demodulator (modem) for accessing another device, system, or network; a radio frequency (RF) or other transceiver; or a telephonic interface, bridge, router, etc. When the computing device is in operation, the processor can be configured to execute software stored within the memory, to communicate data to and from the memory, and to generally control operations of the computing device pursuant to the software. Software in memory, in whole or in part, is read by the processor, perhaps buffered within the processor, and then executed.

Discussion of Possible Embodiments

The following are non-exclusive descriptions of possible embodiments of the present invention.

A system for determining an amplitude of a sinusoidal output waveform from a sensor, the system comprising a controller configured to: provide a sample signal having a sample frequency that is four times a frequency of a sinusoidal excitation waveform provided to the sensor, the sensor having: a primary winding configured to receive the sinusoidal excitation waveform; and a secondary winding, inductively coupled to the primary winding, configured to produce the sinusoidal output waveform when the sinusoidal excitation waveform is provided to the primary winding; measure a first voltage of the sinusoidal output waveform and a second voltage of the sinusoidal output waveform using an analog-to-digital converter (ADC), the second voltage measurement occurring at a time corresponding to a period of the sample frequency following the first voltage measurement; and calculate the amplitude of the sinusoidal output waveform based on the measurements of the first and second voltages.

The system of the preceding paragraph can optionally include, additionally and/or alternatively, any one or more of the following features, configurations and/or additional components:

A further embodiment of the foregoing system, wherein the sensor is a linear variable differential transformer (LVDT); and the sensor is configured to measure a linear position of a linear component mechanically connected thereto.

A further embodiment of the foregoing system, wherein the amplitude is representative of the linear position.

A further embodiment of the foregoing system, wherein the sensor is a resolver further comprising a tertiary winding, wherein: the primary winding is rotatable; the secondary winding is fixed relative to the primary winding; the tertiary winding is fixed relative to the primary winding and positioned out of phase with respect to the secondary winding; and the sensor is configured to measure an angular position of a rotatable component mechanically connected thereto.

A further embodiment of the foregoing system, wherein the tertiary winding is positioned $\pi/2$ radians out of phase with respect to the secondary winding.

A further embodiment of the foregoing system, wherein the amplitude is representative of the angular position of the rotary component.

A further embodiment of the foregoing system, wherein the excitation frequency is between 400-5,000 Hz.

A further embodiment of the foregoing system, wherein the sinusoidal excitation waveform further comprises a peak amplitude between 5-12 volts.

A further embodiment of the foregoing system, wherein the amplitude is a root-mean-square (RMS) amplitude.

A further embodiment of the foregoing system, further comprising: an exciter, configured to receive the excitation signal from the controller and to provide to the primary winding the sinusoidal excitation waveform having the excitation frequency; the sensor; and the ADC.

A method of method of determining an amplitude of a sinusoidal output waveform from a sensor, the method comprising: providing, by a controller, an excitation signal having an excitation frequency to an exciter; providing, by the controller, a sample signal having a sample frequency that is four times the excitation frequency, to an analog-to-digital converter (ADC), supplying, by the exciter, a sinusoidal excitation waveform having the excitation frequency to a primary winding, wherein: the primary winding is inductively coupled to a secondary winding; the secondary winding is configured to produce a sensor waveform when the sinusoidal excitation waveform is supplied to the primary winding; and the secondary winding is configured to input the sensor waveform to an ADC; measuring, by the ADC, a first voltage of the sensor waveform and a second voltage of the sensor waveform, the second voltage measurement occurring at a time corresponding to the period of the sample frequency following the first voltage measurement; and calculating, by the controller, the amplitude based on the measurements of the first and second voltage; wherein the primary winding and the secondary winding comprise a sensor.

The method of the preceding paragraph can optionally include, additionally and/or alternatively, any one or more of the following features, configurations and/or additional components:

A further embodiment of the foregoing method, wherein the sensor is a linear variable differential transformer (LVDT); and the sensor is configured to measure a linear position of a linear component mechanically connected thereto.

A further embodiment of the foregoing method, wherein the amplitude is representative of the linear position.

A further embodiment of the foregoing method, wherein the sensor is a resolver further comprising a tertiary winding, wherein: the primary winding is rotatable; the secondary winding is fixed relative to the primary winding; the tertiary winding is fixed relative to the primary winding and positioned out of phase with respect to the secondary winding; and the sensor is configured to measure an angular position of a rotatable component mechanically connected thereto.

A further embodiment of the foregoing method, wherein the tertiary winding is positioned π/2 radians out of phase with respect to the secondary winding A further embodiment of the foregoing method, wherein the amplitude is representative of the angular position of the rotary component.

A further embodiment of the foregoing method, wherein the excitation frequency is between 400-5,000 Hz.

A further embodiment of the foregoing method, wherein the excitation frequency is between 2,000-3,500 Hz.

A further embodiment of the foregoing method, wherein the sinusoidal excitation waveform further comprises a peak amplitude between 5-12 volts.

A further embodiment of the foregoing method, wherein the amplitude is a root-mean-square (RMS) amplitude.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for determining position of a movable component by calculating an amplitude of a sinusoidal output waveform from a sensor, the system comprising a controller configured to:
    provide a sample signal having a sample frequency that is four times a frequency of a sinusoidal excitation waveform provided to the sensor, the sensor having:
        a primary winding configured to receive the sinusoidal excitation waveform; and
        a secondary winding, inductively coupled to the primary winding in such a manner that the inductive coupling changes in response to movement of the movable member, the secondary winding configured to produce the sinusoidal output waveform when the sinusoidal excitation waveform is provided to the primary winding;
    measure a first voltage of the sinusoidal output waveform and a second voltage of the sinusoidal output waveform using an analog-to-digital converter (ADC), the second voltage measurement occurring at a time corresponding to a period of the sample frequency following the first voltage measurement;
    calculate the amplitude of the sinusoidal output waveform based on the measurements of the first and second voltages; and
    determine a position of a movable component based on the amplitude of the sinusoidal output waveform calculated.

2. The system of claim 1, wherein:
    the sensor is a linear variable differential transformer (LVDT); and
    the sensor is configured to measure a linear position of a linear component mechanically connected thereto.

3. The system of claim 2, wherein the amplitude is representative of the linear position.

4. The system of claim 1, wherein the sensor is a resolver further comprising a tertiary winding, wherein:
    the primary winding is rotatable;
    the secondary winding is fixed relative to the primary winding;
    the tertiary winding is fixed relative to the primary winding and positioned out of phase with respect to the secondary winding; and
    the sensor is configured to measure an angular position of a rotatable component mechanically connected thereto.

5. The system of claim 4, wherein the tertiary winding is positioned π/2 radians out of phase with respect to the secondary winding.

6. The system of claim 4, wherein the amplitude is representative of the angular position of the rotary component.

7. The system of claim 1, wherein the excitation frequency is between 400-5,000 Hz.

8. The system of claim 1, wherein the sinusoidal excitation waveform further comprises a peak amplitude between 5-12 volts.

9. The system of claim 1, wherein the amplitude is a root-mean-square (RMS) amplitude.

10. The system of claim 1, further comprising:
    an exciter, configured to receive the excitation signal from the controller and to provide to the primary winding the sinusoidal excitation waveform having the excitation frequency;
    the sensor; and
    the ADC.

11. A method of determining position of a movable component by calculating an amplitude of a sinusoidal output waveform from a sensor, the method comprising:
    providing, by a controller, an excitation signal having an excitation frequency to an exciter;
    providing, by the controller, a sample signal having a sample frequency that is four times the excitation frequency, to an analog-to-digital converter (ADC),
    supplying, by the exciter, a sinusoidal excitation waveform having the excitation frequency to a primary winding, wherein:
        the primary winding is inductively coupled to a secondary winding in such a manner that the inductive coupling changes in response to movement of the movable member;
        the secondary winding is configured to produce the sinusoidal output waveform when the sinusoidal excitation waveform is supplied to the primary winding; and
        the secondary winding is configured to input the sinusoidal output waveform to an ADC;
    measuring, by the ADC, a first voltage of the sinusoidal output waveform and a second voltage of the sinusoidal output waveform, the second voltage measurement occurring at a time corresponding to a period of the sample frequency following the first voltage measurement;

calculating, by the controller, the amplitude based on the measurements of the first and second voltage; and determining, by the controller, a position of a movable component based on the amplitude of the sinusoidal output waveform calculated, wherein the primary winding and the secondary winding comprise the sensor.

12. The method of claim 11, wherein:

the sensor is a linear variable differential transformer (LVDT); and the sensor is configured to measure a linear position of a linear component mechanically connected thereto.

13. The method of claim 12, wherein the amplitude is representative of the linear position.

14. The method of claim 11, wherein the sensor is a resolver further comprising a tertiary winding, wherein:

the primary winding is rotatable;

the secondary winding is fixed relative to the primary winding;

the tertiary winding is fixed relative to the primary winding and positioned out of phase with respect to the secondary winding; and the sensor is configured to measure an angular position of a rotatable component mechanically connected thereto.

15. The method of claim 14, wherein the tertiary winding is positioned $\pi/2$ radians out of phase with respect to the secondary winding.

16. The method of claim 14, wherein the amplitude is representative of the angular position of the rotary component.

17. The method of claim 11, wherein the excitation frequency is between 400-5,000 Hz.

18. The method of claim 11, wherein the excitation frequency is between 2,000-3,500 Hz.

19. The method of claim 11, wherein the sinusoidal excitation waveform further comprises a peak amplitude between 5-12 volts.

20. The method of claim 11, wherein the amplitude is a root-mean-square (RMS) amplitude.

* * * * *